United States Patent [19]

Berdan et al.

[11] 4,190,474
[45] Feb. 26, 1980

[54] METHOD OF MAKING A PRINTED CIRCUIT BOARD HAVING MUTUALLY ETCHABLE COPPER AND NICKEL LAYERS

[75] Inventors: Betty L. Berdan; Betty M. Luce, both of Willowick, Ohio

[73] Assignee: Gould Inc., Rolling Meadows, Ill.

[21] Appl. No.: 863,109

[22] Filed: Dec. 22, 1977

[51] Int. Cl.$^2$ .............................................. C25D 1/00
[52] U.S. Cl. ................................... 156/151; 29/625; 156/628; 156/666; 156/630; 156/902; 174/68.5; 204/27; 204/49; 428/626; 428/901; 428/639
[58] Field of Search ............... 156/150, 630, 151, 666, 156/309, 901, 628, 902; 428/901, 639, 626; 204/27, 49; 29/625; 174/68.5

[56] References Cited

U.S. PATENT DOCUMENTS

| | | | |
|---|---|---|---|
| 2,233,546 | 3/1941 | Meulendyke | 156/666 |
| 2,326,999 | 8/1943 | Lind et al. | 204/49 |
| 2,984,595 | 5/1961 | Schumpelt et al. | 204/49 |
| 3,183,067 | 5/1965 | Du Rose et al. | 428/639 |
| 3,454,376 | 7/1969 | Luce et al. | 428/607 |
| 3,585,010 | 6/1971 | Luce et al. | 428/626 |
| 3,591,350 | 7/1971 | Stareck et al. | 428/626 |
| 4,010,005 | 3/1977 | Morisaki et al. | 428/639 |
| 4,061,837 | 12/1977 | Hutkin | 156/151 |

*Primary Examiner*—John T. Goolkasian
*Assistant Examiner*—J. J. Gallagher
*Attorney, Agent, or Firm*—Russell E. Baumann; Edward E. Sachs

[57] ABSTRACT

A readily etchable printed circuit board is provided which comprises a resinous substrate having bonded to at least one surface thereof a composite metal structure. This metal structure includes a layer of copper foil having opposed first and second surfaces and a thin layer of nickel having opposed first and second surfaces with one of the surfaces of the copper foil being bonded to one of the surfaces of the nickel layer and the opposite opposed surface of the nickel layer being bonded to the resinous substrate with the nickel layer containing an effective amount of sulfur to render the copper foil and the nickel barrier layer mutually etchable, i.e., etchable by the same etchant. The preferred amount of sulfur ranges from about 0.05 to about 10.0 weight percent.

5 Claims, No Drawings

METHOD OF MAKING A PRINTED CIRCUIT BOARD HAVING MUTUALLY ETCHABLE COPPER AND NICKEL LAYERS

BACKGROUND OF THE INVENTION

The present invention relates to nickel coated copper foils which are readily etched. More particularly, it concerns a printed circuit board or blank which comprises a resinous substrate having bonded thereto, via a barrier layer of nickel, a layer of copper foil with the layer of nickel being characterized by its unique etchability.

Printed circuits are widely used in a variety of electronic applications, such as radios, televisions, computers, etc. Of particular interest are multi-layer laminates which have been developed to meet the demand for miniature electronic articles and the growing need for printed circuit boards having a high density of interconnections. These laminates of synthetic plastics or resins and copper foil are made in such a way that circuits are possible not only on the surface but also spaced throughout the thickness of the laminates. In order for the single or multi-layer laminate to operate satisfactorily the resistivity of the plastic layer and the peel strength of the copper foil, among other things, must be maintained as high as possible. Thus, strict production quality control measures are followed, and special requirements on raw materials, such as the copper foil and the adhesive, are imposed. In U.S. Pat. No. 3,220,897 there is disclosed a copper foil which has been treated electrolytically to provide it with a "nodularized" surface for better adhesion. Similarly, in U.S. Pat. No. 3,293,109 a copper foil is found to have better adhesive properties when provided with an external surface having myriad minute projections whose inner cores contain copper-copper oxide particles, the minute projections being encapsulated by a copper coating.

The two types of copper foil as taught by the two above-mentioned patents are excellent when it comes to adhesion, whether in one layer or multi-layer laminates. One source of difficulty, however, has been the frequent appearance of stains and spottings throughout the resinous layer of the finished printed circuit boards. These stains of which brown spotting is a particularly troublesome type tend to adversely affect the dielectric properties of the resin and consequently the over-all performance of the printed circuit. Likewise, the physical appearance of the final product is undesirable.

The actual mechanism for this staining is not fully understood; however, the cause appears to be the result of chemical and/or mechanical interactions between the copper foil and the resin layer. The lamination step which involves high pressure-high temperature treatment seems to give rise to such interactions which are manifested as degradation of the adhesion of the foil upon heat aging together with staining of the epoxy/glass board.

To overcome the above-discussed staining and spotting problems, a technique has been developed wherein a barrier layer of metal is applied to the surface of the copper foil which is to be bonded to the resinous substrate. This system is described in U.S. Pat. No. 3,585,010. In practice, the printed circuit is formed by selectively etching away portions of the copper foil and nickel barrier layer. While this system has met with success, when nickel is employed as the barrier layer it suffers from the inherent limitation that of the common copper etchants only ferric chloride also readily dissolves nickel. Unfortunately, in many commercial operations it is often desirable to use copper etchants other than ferric chloride.

Accordingly, it is the principal object of the present invention to provide a nickel barrier layer which is readily etchable by a plurality of common copper etchants.

Other objects of the invention will become apparent to those skilled in the art from a detailed reading of the specification and claims.

SUMMARY OF THE INVENTION

Broadly, the present invention concerns the provision of a nickel barrier layer which is readily etched by most copper etchants and the method of producing the same.

In one aspect, it concerns a composite metal structure including a sheet of copper foil having deposited on one surface thereof a layer of nickel which contains an effective amount of sulfur to render the copper foil and the nickel barrier layer mutally etchable, i.e., etchable by the same etchant. The preferred amount of sulfur ranges from about 0.05 to about 10.0 weight percent.

In another aspect, it concerns a readily etchable printed circuit board comprising a resinous substrate having bonded to at least one surface thereof a composite metal structure including a layer of copper foil having opposed first and second surfaces and a thin layer of nickel having opposed first and second surfaces with one of the surfaces of the copper foil being bonded to one of the surfaces of the nickel layer and the opposite opposed surface of the nickel layer being bonded to the resinous substrate, with the nickel layer containing an effective amount of sulfur to render the copper foil and the nickel barrier layer mutually etchable, i.e., etchable by the same etchant. The preferred amount of sulfur ranges from about 0.05 to about 10.0 weight percent.

In still another aspect, the present invention concerns a method of producing a readily etchable printed circuit board including a resinous substrate and a sheet of copper foil having a nickel barrier layer deposited on one surface thereof with the opposite surface of said nickel layer being bonded to said resinous substrate which comprises providing a sheet of copper foil, depositing a layer of nickel on a surface of said sheet of copper foil which contains an effective amount of sulfur to render the copper foil and the nickel barrier layer mutually etchable, i.e., etchable by the same etchant, and bonding the exposed surface of said nickel barrier layer to said resinous substrate. The preferred amount of sulfur ranges from about 0.05 to about 10 weight percent.

DESCRIPTION OF THE PREFERRED EMBODIMENTS OF THE INVENTION

Any form of copper foil can be used in the practice of the invention. For example, both rolled and electrolytically deposited copper foil can be utilized. However, in the production of thin printed circuit boards, it is most desirable to use copper foil which has been produced electrolytically. Copper foil which has been subjected to any one of the various well known techniques for rendering it more bondable to a resinous substrate can also be used in the practice of the instant invention. Since the manner of producing the copper foil is well known in the art, it will not be discussed herein.

The specific type of electrolysis bath utilized to deposit the nickel layer is not critical, so long as the bath contains a sufficient amount of a sulfur containing addition agent to cause the deposited nickel layer to contain an adequate amount of sulfur. In this regard, to realize the benefits of the present invention the nickel layer should contain an effective amount of sulfur to render the copper foil and the nickel barrier layer mutually etchable, i.e., etchable by the same etchant. The preferred amount of sulfur ranges from about 0.05 to about 10.0 weight percent sulfur, with the most preferred amount ranging from about 0.1 to about 5.0 weight percent. As various bath compositions for electroplating nickel are well known, for the sake of brevity, they will not be discussed herein in detail.

Addition agents which are ideal for use in connection with the present invention are organic sulfonates, sulfonamides and sulfonimides. The preferred addition agents are the so-called class I brighteners used in conventional bright nickel plating which result in sulfur-containing nickel deposits. Typical examples include benzene disulfonic acid, benzene trisulfonic acid, naphthalene disulfonic acid, naphthalene trisulfonic acid, benzene sulfonamides and sulfonimides.

When it is desired to produce a low sulfur nickel alloy, saccharin preferably is used. However, if a high sulfur containing alloy is desired the thiocyanates and thiosulfates are preferably employed. The exact amount of addition agent is determined emperically. That is, the addition agent is utilized in an amount sufficient to cause the nickel layer to contain an effective amount of sulfur to render the copper foil and the nickel barrier layer mutually etchable, i.e., etchable by the same etchant, preferably, at the same relative speed. The preferred amount of sulfur ranges from about 0.05 to about 10.0 weight percent.

The present invention will now be illustrated with reference to the following examples wherein Example I represents the conventional practice (prior art) with the nickel barrier layer being sulfur free while Examples II–VI depict the practice of the invention.

EXAMPLE I

A nickel barrier layer was plated on nodularized one-ounce copper foil from the following solution:
NISO$_4$.6H$_2$O: 240 grams per liter
NiCl$_2$.6H$_2$O: 45 grams per liter
Boric Acid: 30 grams per liter The current density employed was 20 amperes per square foot, temperature 40°–45° C., pH 2.5–3.0, plating time 30 seconds. The thickness of the barrier layer is 8–10 millionths of an inch. The copper foil-nickel layer was then laminated with General Electric Fr4 epoxy 1 glass. The laminated sample was then spray-etched with a solution of 240 grams per liter of ammonium persulfate containing a mercuric chloride catalyst. The copper is etched away but nickel barrier remains on the board.

EXAMPLE II

The procedure of Example I was repeated with an addition of 1 gram per liter of saccharin (sodium form) being made to the nickel plating bath. Laminated samples etched in the ammonium persulfate solution showed a clean etch of both copper and the nickel alloy barrier. Chemical analysis showed the nickel barrier deposit contained 0.062 percent sulfur.

EXAMPLE III

The procedure of Example I was repeated with the following solution:
NiSO$_4$.6H$_2$O: 240 grams per liter
NiCl$_2$.6H$_2$O: 45 grams per liter
Boric Acid: 30 grams per liter
2 percent (volume (Udylite proprietary sulfur contain addition agent): Tri-Ni Laminated samples etched in the ammonium persulfate solution showed a clean etch of both the copper and the nickel alloy barrier. Chemical analysis showed the nickel barrier contained 0.2 percent sulfur.

EXAMPLE IV

The procedure of Example I was repeated with the following solution:
nickel sulfamate: 300 grams per liter
potassium thiocyanate: 20 grams per liter
ammonium sulfate: 15 grams per liter
pH 4.0–4.2
temperature, 40° C.

Laminated samples etched in the ammonium persulfate solution showed a clean etch of both copper and the nickel alloy barrier. Chemical analysis showed the nickel barrier contained 0.16 percent sulfur.

EXAMPLE V

The procedure of Example I was repeated with the following solution:
NiSO$_4$.6H$_2$O: 100 grams per liter
sodium thiosulfate: 10 grams per liter
sodium citrate: 15 grams per liter
pH 2.5–3.0
temperature 30° C.

Laminated samples etched in the ammonium persulfate solution showed a clean etch of both the copper and the nickel. Chemical analysis showed the nickel alloy barrier contained 3.2 percent sulfur.

EXAMPLE VI

The general procedure of Example I was repeated with the following solution:
NiCl$_2$.6H$_2$O: 50 grams per liter
NH$_4$Cl: 100 grams per liter
Saccharin: 2 grams per liter
pH to 6.0 with NH$_4$OH
Room temperature The current density employed was 150 amperes per square foot, plating time 15 seconds. The thickness of the barrier layer, which contained 0.13 percent sulfur, was about 28–30 millionths of an inch. Laminated samples etched in the ammonium persulfate solution showed a clean etch of both copper and the nickel alloy barrier.

Barrier layers produced by the method described in Example VI have a suede-like or nodular matte appearance and possess an additional, unique advantage not obtained with the teachings of Examples II through V. That is, in addition to providing a mutually etchable barrier layer, foils produced according to Example VI provide an improvement in peel strength of 3–4 pounds per inch, when laminated to General Electric FR4 epoxy resin. The barrier layers described in Examples II through V maintain the original peel strength of the copper foil but do not increase it.

The increase in peel strength provided by Example VI is attributed to the fact that this barrier does not merely cover the existing structure but actually increases the roughness by nodular growth during the barrier treatment. This data has been supported by scanning electron micrographs of the surfaces before and after barriers are applied.

Both the copper foil and nickel barrier layer of specimens prepared according to Examples II through VI were also etched in cupric chloride and chromic-sulfuric acid with excellent results. That is, these etchants mutually dissolved both the copper and nickel layers.

Composite metal structures (i.e., copper foil having a nickel barrier layer deposited thereon) are bonded to the resinous substrate by conventional laminating techniques. As these techniques and types of substrates are well known in the art and do not form a part of the present invention, they will not be discussed in detail herein.

In addition, in the practice of the present invention, the desired electrical circuit is formed on the copper foil in the conventional manner. As such techniques are well known in the art, they will not be discussed in detail herein.

In the manufacture of printed circuits, a variety of etchants are utilized with the specific one employed being a function of the etching processor's facilities and requirements. However, the general class of etches in commercial use today are ferric chloride, ammonium persulfate, cupric chloride, and a chromic-sulfuric acid combination, respectively. All of these work well with material produced according to the present invention. Ideal results were obtained when the foregoing etchants were used to mutually etch copper having a nickel barrier layer which contained as little as 0.05 weight percent sulfur.

In addition, there are also commercially available various alkaline etches. Such an etchant is disclosed in U.S. Pat. No. 3,466,208. Nickel-sulfur alloys containing 2 to 3 weight percent sulfur were successfully mutually (along with copper) removed with this type of etchant.

While there have been described what are at present considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A method of producing a readily etchable printed circuit board including a resinous substrate and a sheet of copper foil having a nickel barrier layer deposited on one surface thereof with the opposite surface of said nickel layer being bonded to said resinous substrate which comprises:

providing a sheet of copper foil, depositing a layer of nickel on a surface of said sheet of copper foil in which said nickel layer contains an effective amount of sulfur to render said copper foil and said nickel barrier layer mutually etchable, and bonding the exposed surface of said nickel barrier layer to said resinous substrate.

2. The method of claim 1 wherein said sulfur is present in an amount ranging from about 0.05 to about 10.0 weight percent.

3. The method of claim 1 wherein said layer of nickel is electrolytically deposited from a nickel-ion containing bath.

4. The method of claim 3 wherein said bath contains an addition agent selected from the group consisting of organic sulfonates, sulfonates, sulfonamides and sulfonimides.

5. The method of claim 4 wherein said addition agent is saccharin.

* * * * *